(12) United States Patent
Liu et al.

(10) Patent No.: US 11,088,352 B2
(45) Date of Patent: Aug. 10, 2021

(54) DISPLAY SUBSTRATE, MANUFACTURING METHOD THEREOF, AND DISPLAY DEVICE

(71) Applicant: BOE Technology Group Co., Ltd., Beijing (CN)

(72) Inventors: Wenqu Liu, Beijing (CN); Feng Zhang, Beijing (CN); Qi Yao, Beijing (CN); Zhijun Lv, Beijing (CN); Liwen Dong, Beijing (CN); Shizheng Zhang, Beijing (CN); Ning Dang, Beijing (CN); Xiaoxin Song, Beijing (CN); Zhao Cui, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/429,531

(22) Filed: Jun. 3, 2019

(65) Prior Publication Data

US 2020/0083481 A1    Mar. 12, 2020

(30) Foreign Application Priority Data

Sep. 6, 2018    (CN) .......................... 201811037594.8

(51) Int. Cl.
*H01L 51/52* (2006.01)
*H01L 51/56* (2006.01)
(Continued)

(52) U.S. Cl.
CPC ...... *H01L 51/5256* (2013.01); *H01L 27/3211* (2013.01); *H01L 27/3244* (2013.01); *H01L 51/0097* (2013.01); *H01L 51/56* (2013.01)

(58) Field of Classification Search
CPC . H01L 51/5256; H01L 51/56; H01L 51/0097; H01L 27/3211; H01L 27/3244;
(Continued)

(56) References Cited

U.S. PATENT DOCUMENTS

2003/0227021 A1  12/2003  Yamazaki et al.
2009/0109435 A1*  4/2009  Kahen ................. C09K 11/883
                                                        356/317
(Continued)

FOREIGN PATENT DOCUMENTS

CN    107785393 A    3/2018
CN    108242455 A    7/2018

OTHER PUBLICATIONS

First office action of Chinese application No. 201811037594.8 dated Mar. 25, 2020.

*Primary Examiner* — Joseph L Williams
*Assistant Examiner* — Jose M Diaz
(74) *Attorney, Agent, or Firm* — Fay Sharpe LLP

(57) ABSTRACT

A display substrate, a manufacturing method thereof, and a display device are provided, in the field of display technology. The display substrate includes a base substrate, and a thin-film transistor, a light-emitting device, an encapsulation structure, and a conductive film layer sequentially disposed on the base substrate in a direction away from the base substrate. Since the display substrate includes a conductive film layer on a side of the encapsulation structure away from the base substrate, when the protective film layer on the side of the conductive film layer away from the base substrate is peeled off, static electricity generated by the separation of the film layer can be released to the conductive film layer, avoiding electron transition to the active layer of the thin-film transistor in the display substrate to cause offset of the threshold voltage of the thin-film transistor. The display brightness uniformity of the display substrate can be ensured.

17 Claims, 11 Drawing Sheets

(51) Int. Cl.
*H01L 27/32* (2006.01)
*H01L 51/00* (2006.01)

(58) Field of Classification Search
CPC ............... H01L 51/5237; H01L 51/524; H01L 51/5253; H05B 33/04
See application file for complete search history.

(56) References Cited

U.S. PATENT DOCUMENTS

| | | | |
|---|---|---|---|
| 2013/0088672 A1* | 4/2013 | Shin | G02F 1/133512 |
| | | | 349/110 |
| 2015/0075706 A1* | 3/2015 | Cheng | H01L 21/6835 |
| | | | 156/247 |
| 2016/0276368 A1* | 9/2016 | Chai | H01L 22/32 |
| 2017/0278899 A1* | 9/2017 | Yang | H01L 51/0097 |
| 2018/0011381 A1* | 1/2018 | Gao | G02F 1/133345 |
| 2018/0061894 A1 | 3/2018 | Kim | |
| 2018/0095567 A1* | 4/2018 | Lee | H01L 51/5253 |
| 2018/0182816 A1 | 6/2018 | Kang et al. | |
| 2018/0277614 A1* | 9/2018 | Ono | H01L 27/1251 |
| 2018/0331160 A1* | 11/2018 | Beak | H01L 27/323 |
| 2019/0018530 A1* | 1/2019 | Lee | G06F 3/0412 |

* cited by examiner

DISPLAY SUBSTRATE, MANUFACTURING METHOD THEREOF, AND DISPLAY DEVICE

CROSS-REFERENCE TO RELATED APPLICATION

This application claims priority to Chinese Patent Application No. 201811037594.8, filed on Sep. 6, 2018 and entitled "DISPLAY SUBSTRATE, MANUFACTURING METHOD THEREOF, AND DISPLAY DEVICE", the entire contents of which are incorporated herein by reference.

TECHNICAL FIELD

The present disclosure relates to the field of display technology, and particularly to a display substrate, a manufacturing method thereof, and a display device.

BACKGROUND

An organic light-emitting diode (OLED) device, as a flexible light-emitting device, can be used to manufacture a flexible display substrate. The flexible OLED display substrate generally includes a flexible base substrate, and a Thin Film Transistor (TFT), an OLED device, and an encapsulation structure which are sequentially disposed on the flexible base substrate in a direction away from the flexible base substrate.

SUMMARY

The present disclosure provides a display substrate, a manufacturing method thereof, and a display device. The technical solutions are as follows.

In a first aspect, there is provided a display substrate, comprising: a base substrate, and a thin-film transistor, a light-emitting device, an encapsulation structure, and a conductive film layer sequentially disposed on the base substrate in a direction away from the base substrate.

Optionally, the conductive film layer is a transparent conductive film layer.

Optionally, the conductive film layer totally covers a side of the encapsulation structure away from the base substrate.

Optionally, an orthographic projection of the conductive film layer on the base substrate and an orthographic projection of a light-emitting area of the light-emitting device on the base substrate do not have an overlapping area.

Optionally, the conductive film layer is made of an indium tin oxide material.

Optionally, a thickness of the conductive film layer ranges from 600 angstroms to 800 angstroms.

Optionally, the encapsulation structure comprises a plurality of laminated encapsulation layers, the plurality of encapsulation layers comprising an inorganic encapsulation layer and an organic encapsulation layer.

Optionally, the encapsulation structure comprises a first inorganic encapsulation layer, an organic encapsulation layer, and a second inorganic encapsulation layer disposed in a direction away from the base substrate.

Optionally, material of the first inorganic encapsulation layer is different from material of the second inorganic encapsulation layer.

Optionally, the first inorganic encapsulation layer is made of a silicon oxynitride material, and the second inorganic encapsulation layer is made of a silicon nitride material.

Optionally, the thin-film transistor comprises at least one of a low-temperature polysilicon transistor and an oxide transistor.

Optionally, the display substrate has a display area and a peripheral area surrounding the display area; and a thin-film transistor in a pixel circuit in the display area is the oxide transistor, and a thin-film transistor in a drive circuit in the peripheral area is the low-temperature polysilicon transistor.

Optionally, the base substrate is a flexible base substrate, an orthographic projection of the conductive film layer on the base substrate and an orthographic projection of a light-emitting area of the light-emitting device on the base substrate have no overlapping area; and the encapsulation structure comprises a first inorganic encapsulation layer, an organic encapsulation layer, and a second inorganic encapsulation layer disposed in a direction away from the base substrate.

In another aspect, there is provided a method for manufacturing a display substrate, comprising:
  forming a flexible base substrate on a rigid substrate;
  forming a thin-film transistor and a light-emitting device sequentially on the flexible base substrate;
  forming an encapsulation structure on a side of the light-emitting device away from the base substrate;
  forming a conductive film layer on a side of the encapsulation structure away from the base substrate;
  forming a protective film layer on a side of the conductive film layer away from the base substrate;
  separating the rigid substrate from the flexible base substrate by using a layering technique; and
  peeling off the protective film layer.

Optionally, forming a conductive film layer on a side of the encapsulation structure away from the base substrate comprises:
  forming a transparent conductive film layer totally covering the surface of the encapsulation structure on the side of the encapsulation structure away from the base substrate with a transparent conductive material.

Optionally, forming a conductive film layer on a side of the encapsulation structure away from the base substrate comprises:
  forming a whole layer of conductive thin-film on the side of the encapsulation structure away from the base substrate with a conductive material; and
  patterning the conductive thin-film to obtain the conductive film layer, wherein an orthographic projection of the conductive film layer on the base substrate and an orthographic projection of a light-emitting area of the light-emitting device on the base substrate have no overlapping area.

Optionally, forming a conductive film layer on a side of the encapsulation structure away from the base substrate comprises:
  forming the conductive film layer on the side of the encapsulation structure away from the base substrate by one of a low temperature physical vapor deposition method and a low temperature sputtering method.

Optionally, forming an encapsulation structure on a side of the light-emitting device away from the base substrate comprises:
  forming a first inorganic encapsulation layer on the side of the light-emitting device away from the base substrate;
  forming an organic encapsulation layer on a side of the first inorganic encapsulation layer away from the base substrate; and forming a second inorganic encapsulation layer on a side of the organic encapsulation layer away from the base substrate.

Optionally, forming a protective film layer on a side of the conductive film layer away from the base substrate comprises:

attaching a protective film sheet on the side of the conductive film layer away from the base substrate; and
peeling off the protective film layer comprises:
peeling off the protective film sheet.

In yet another aspect, there is provided a display device, comprising a display substrate; wherein the display substrate comprises a base substrate, and a thin-film transistor, a light-emitting device, an encapsulation structure, and a conductive film layer sequentially disposed on the base substrate in a direction away from the base substrate.

DETAILED DESCRIPTION

Embodiments of the present disclosure will be described in further detail with reference to the accompanying drawings, to present the objects, technical solutions, and concepts of the present disclosure more clearly.

The preparation process of a flexible OLED display substrate known to the inventors includes: forming a flexible base substrate on a glass substrate: forming a TFT, an OLED device, and an encapsulation structure sequentially on the flexible base substrate; Forming a Temporary Protect Film (TPF) on a side of the encapsulation structure away from the flexible base substrate; separating the glass substrate and the flexible base substrate by a layering technique; peeling off the TPF on the side of the encapsulation structure away from the flexible base substrate to obtain a flexible OLED display substrate. Here, the TPF is configured to protect the encapsulation structure, avoiding the encapsulation structure from being damaged during the process of separating the glass substrate and the flexible base substrate to affect the encapsulation effect on the OLED device.

However, in the process of peeling off the TPF, an Electro Static Discharge (ESD) phenomenon occurs due to separation of the film layer. The electrons may transition to the active layers of a part of the TFTs in the flexible OLED display substrate, causing a change in the resistance value of the active layer, thereby causing offset of the threshold voltage of the portion of the TFT to affect the display brightness uniformity of the flexible OLED display substrate.

Figure 1:
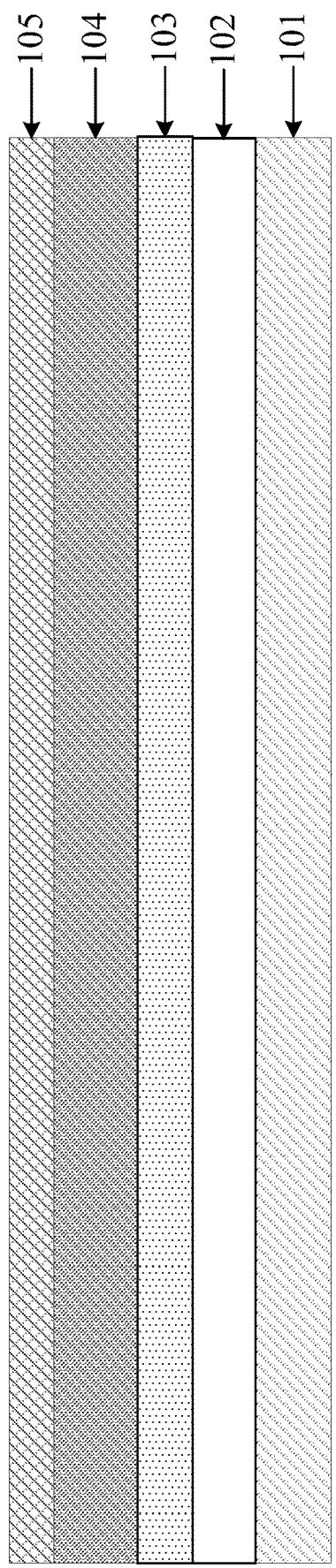
FIG. 1 is a structural schematic diagram of a display substrate according to an embodiment of the present disclosure.

FIG. 1 is a structural schematic diagram of a display substrate according to an embodiment of the present disclosure. As shown in FIG. 1, the display substrate includes a base substrate 101, and a thin-film transistor 102, a light-emitting device 103, an encapsulation structure 104, and a conductive film layer 105 which are sequentially disposed on the base substrate 101 in a direction away from the base substrate 101.

Optionally, the light-emitting device may be an OLED device, such as an Active Matrix Oxide Light Emitting Diode (AMOLED) device. Alternatively, the light-emitting device may also be a Quantum Dot Light Emitting Diodes (QLED) device, which is not limited in this embodiment of the present disclosure. The light-emitting device may include an anode, a hole injection layer, a hole transport layer, a light-emitting material layer, an electron transport layer, an electron injection layer, and a cathode which are laminated. When the light-emitting device is an OLED device, the light-emitting material layer is an organic light-emitting material layer. When the light-emitting device is a QLED device, the light-emitting material layer is a quantum dot material layer.

Since the light-emitting effect of the light-emitting material layer in the light-emitting device will be affected after the light-emitting material layer is in contact with water or oxygen, the light-emitting device can be protected by disposing an encapsulation structure, and water or oxygen is prevented from entering the interior of the display substrate to affect the quality and service life of the light-emitting device.

Optionally, the base substrate is a flexible base substrate. For example, the base substrate may be a flexible polyimide (PI) film.

In summary, the display substrate provided in the embodiment of the present disclosure includes a conductive film layer on a side of the encapsulation structure away from the base substrate. Thus, in the process of preparing the display substrate, when the protective film layer on the side of the conductive film layer away from the base substrate is peeled off, static electricity generated by the separation of the film layer can be released to the conductive film layer. Thereby, the problem that electrons transition to the active layer of the thin-film transistor in the display substrate when the protective film layer is peeled off to cause offset of the threshold voltage of the thin-film transistor is avoided, and the display brightness uniformity of the display substrate can be ensured.

Optionally, the conductive film layer may be a transparent conductive film layer. That is, the material for forming the conductive film layer may be a transparent conductive material. For example, the material for forming the transparent conductive film layer may be an indium tin oxide (ITO) material.

It should be noted that by providing the conductive film layer as a transparent conductive film layer, the conductive film layer can be prevented from affecting the light-emitting effect of the light-emitting device, thereby ensuring the light-emitting efficiency of the display substrate.

As an optional implementation, when the conductive film layer is a transparent conductive film layer, as shown in FIG. 1, the transparent conductive film layer 105 may totally cover the surface of the encapsulation structure 104 (the side away from the base substrate). That is, a transparent conductive film layer 105 totally covering the surface of the encapsulation structure 104 may be formed on the side of the encapsulation structure 104 away from the base substrate 101. The manufacturing process of the display substrate can be simplified by providing a whole transparent conductive film layer on the surface of the encapsulation structure.

Figure 2:
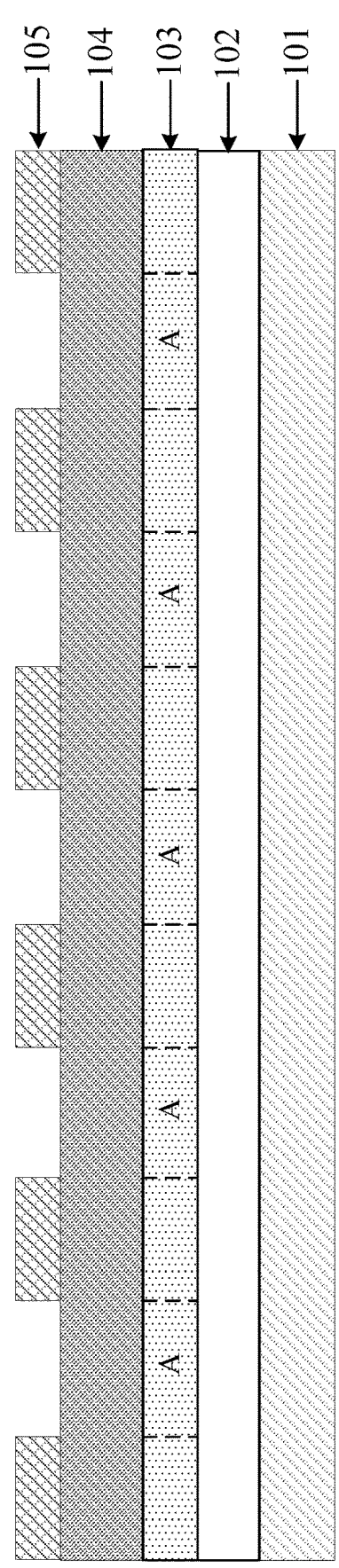
FIG. 2 is a structural schematic diagram of another display substrate according to an embodiment of the present disclosure.

As another optional implementation, FIG. 2 is a structural schematic diagram of another display substrate according to an embodiment of the present disclosure. As shown in FIG. 2, there is no overlapping area between the orthographic projection of the conductive film layer 105 on the base substrate 101 and the orthographic projection of the light-emitting area A of the light-emitting device 103 on the base substrate 101.

Figure 3:
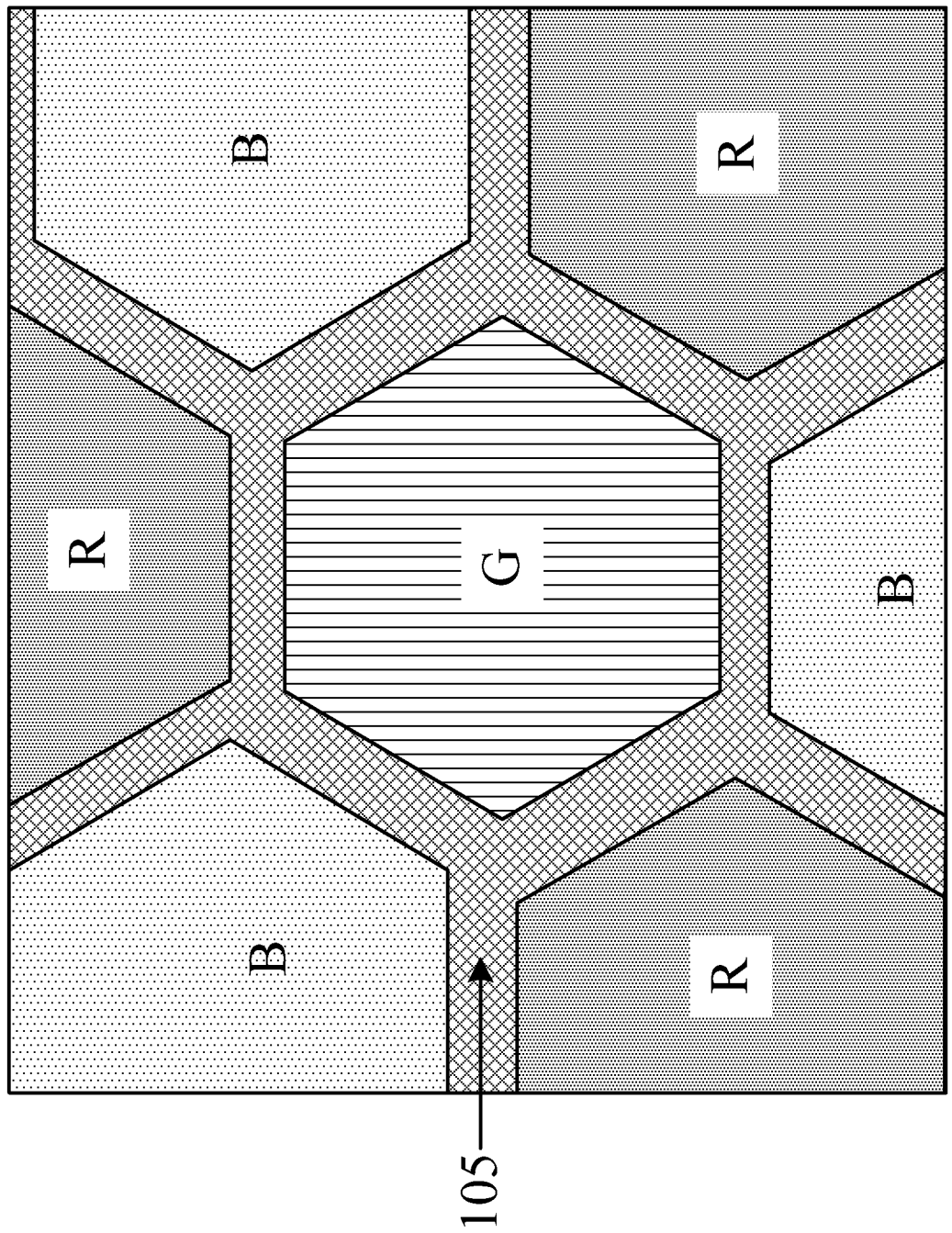
FIG. 3 is a top view of a display substrate according to an embodiment of the present disclosure.

Exemplarily, FIG. 3 is a top view of a display substrate provided in an embodiment of the present disclosure. As shown in FIG. 3, the light-emitting device includes red pixels R, green pixels G, and blue pixels B. The orthographic projection of the conductive film layer 105 on the light-emitting device does not overlap with the light-emitting areas of the red pixels R, the green pixels G, and the blue pixels B.

It should be noted that by enabling the orthographic projection of the conductive film layer on the base substrate to have no overlapping area with the orthographic projection of the light-emitting area of the light-emitting device on the base substrate, the light-emitting area of the light-emitting device can be effectively prevented from being shielded by the conductive film layer to affect the light-emitting effect, which further ensures the display effect of the display substrate. In the display substrate as shown in FIG. 2, the conductive film layer may be a transparent conductive film layer or a non-transparent conductive film layer, which is not limited in the embodiment of the present disclosure.

Optionally, in the embodiment of the present disclosure, the thickness of the conductive film layer ranges from 600 angstroms to 800 angstroms. For example, the conductive film layer may have a thickness of 700 angstroms.

Optionally, the encapsulation structure provided in the embodiment of the present disclosure may include a plurality of laminated encapsulation layers, which include inorganic encapsulation layers and organic encapsulation layers. Any two encapsulation layers in the encapsulation structure may be made of different materials. Here, the inorganic encapsulation layer is configured to block water and oxygen from intruding into the light-emitting device. The organic encapsulation layer is configured to increase the length of the permeation channel and release the stress between the inorganic encapsulation layers. The organic encapsulation layer also plays a flattening function.

Optionally, the inorganic material for preparing the inorganic encapsulation layer includes at least one of silicon oxynitride (SiNO), silicon oxide (SiOx), and silicon nitride (SiNx). The organic material for preparing the organic encapsulating layer includes at least one of a PI material and a polyethylene terephthalate (PET) material.

Figure 4:
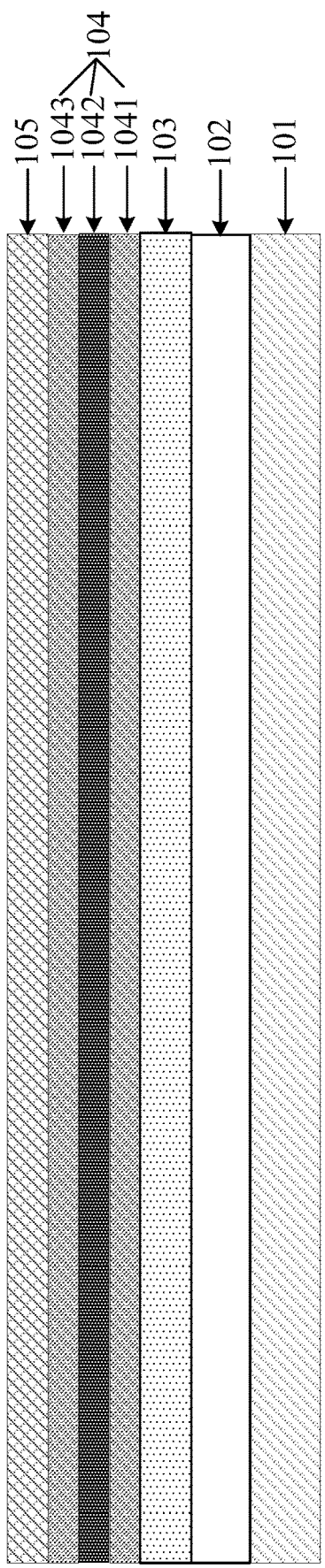
FIG. 4 is a structural schematic diagram of yet another display substrate according to an embodiment of the present disclosure.

Optionally, FIG. 4 is a structural schematic diagram of still another display substrate provided by an embodiment of the present disclosure. As shown in FIG. 4, the encapsulation structure 104 may include a first inorganic encapsulation layer 1041, an organic encapsulation layer 1042, and a second inorganic encapsulation layer 1043 disposed in a direction away from the base substrate 101.

Figure 5:
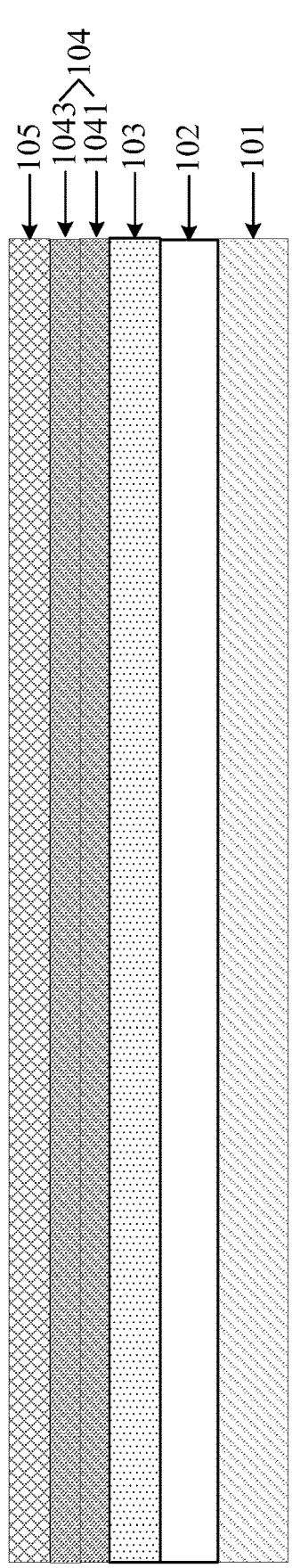
FIG. 5 is a structural schematic diagram of still yet another display substrate according to an embodiment of the present disclosure.

In the embodiment of the present disclosure, the encapsulation structure may also include no organic encapsulation layer, but only include a plurality of inorganic encapsulation layers. Optionally, FIG. 5 is a structural schematic diagram of still yet another display substrate according to an embodiment of the present disclosure. As shown in FIG. 5, the encapsulation structure 104 may include a first inorganic encapsulation layer 1041 and a second inorganic encapsulation layer 1043 which are laminated.

Optionally, the material of the first inorganic encapsulation layer and the material of the second inorganic encapsulation layer in FIG. 4 and FIG. 5 are different. For example, the first inorganic encapsulation layer may be made of a SiON material, and the second inorganic encapsulation layer may be made of a SiNx material.

Optionally, in the display substrate provided in the embodiment of the present disclosure, the thin-film transistor includes at least one of a low temperature polycrystalline (LTPS) transistor and an oxide transistor. That is, the display substrate includes an LTPS transistor. Alternatively, the display substrate includes an oxide transistor. Alternatively, the display substrate includes an LTPS transistor and an oxide transistor.

Optionally, the display substrate provided in the embodiment of the present disclosure may be an LTPS display substrate, or an Oxide display substrate, or a Low Temperature Polycrystalline Oxide (LTPO) display substrate, which is not limited in the embodiment of the present disclosure. Here, the LTPO display substrate is a display substrate including an LTPS transistor and an oxide transistor.

Figure 6:
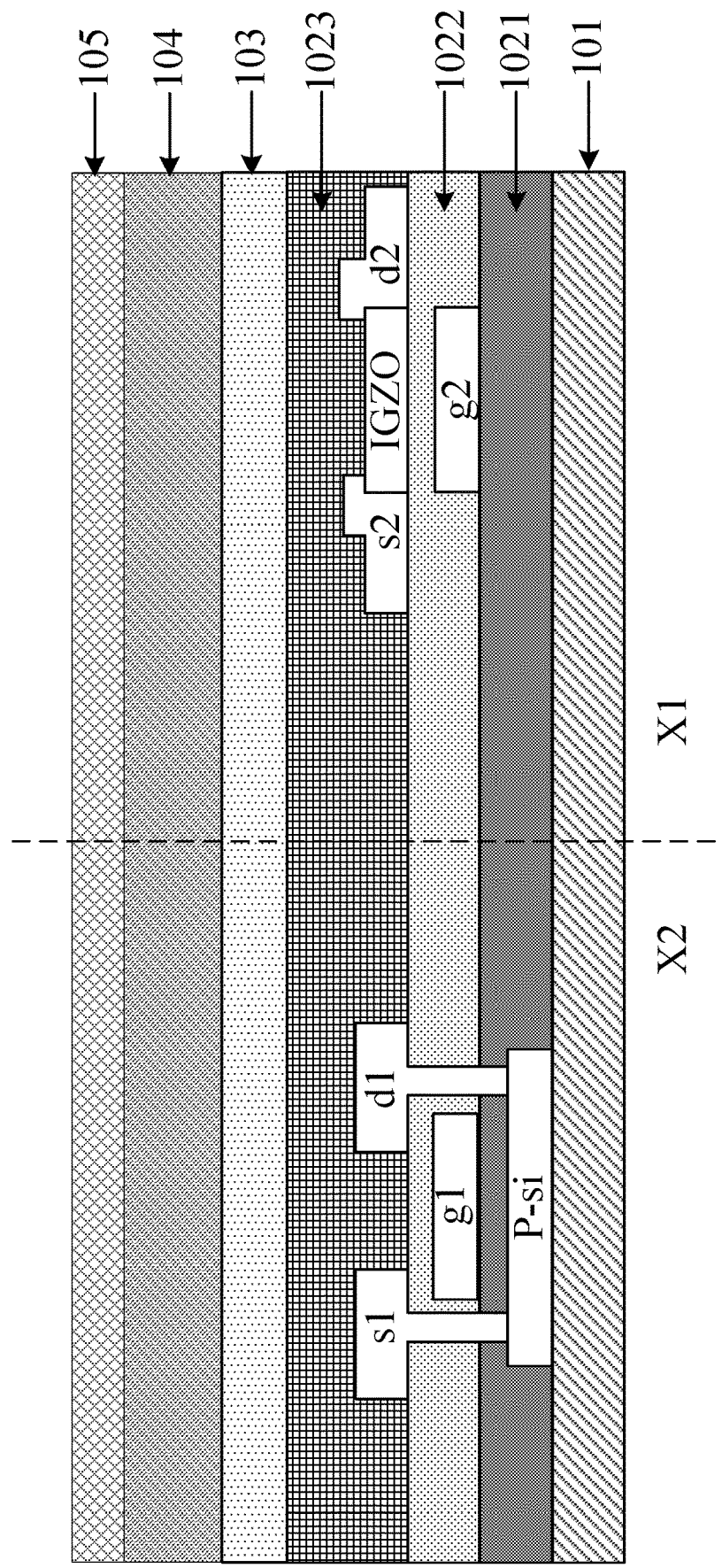
FIG. 6 is a structural schematic diagram of an LTPO display substrate according to an embodiment of the present disclosure.

Exemplarily, FIG. 6 is a structural schematic diagram of an LTPO display substrate provided in an embodiment of the present disclosure. As shown in FIG. 6, the LTPO display substrate has a display area X1 and a peripheral area X2 surrounding the display area X1 (only a partial area of the LTPO display substrate is shown in the drawing). The thin-film transistor in the pixel circuit in the display area X1 is an oxide transistor, and the thin-film transistor in the drive circuit in the peripheral area X2 is an LTPS transistor.

Referring to FIG. 6, an active layer of the LTPS transistor in the peripheral area X2 may be made of a P-type silicon (P-si) material. The active layer of the LTPS transistor is disposed on the base substrate 101. A side of the active layer away from the base substrate 101 is provided with a gate insulating layer 1021. A gate g1 of the LTPS transistor is disposed on the side of the gate insulating layer 1021 away from the base substrate 101. An intermedium layer 1022 is disposed on the side of the gate g1 away from the base substrate 101. A source s1 and a drain d1 of the LTPS transistor are disposed on the side of the intermedium layer 1022 away from the base substrate 101. A flat layer 1023 is disposed on the side of the source s1 and the drain d1 away from the base substrate 101. The flat layer may be made of a resin material.

With continued reference to FIG. 6, an active layer of the oxide transistor in the display area X1 may be made of an Indium Gallium Zinc Oxide (IGZO) material. A gate g2 of the oxide transistor is disposed on the side of the gate insulating layer 1021 away from the base substrate 101. An active layer, a source s2, and a drain d2 of the oxide transistor are disposed on the side of the intermedium layer 1022 away from the base substrate 101.

In summary, the display substrate provided in the embodiment of the present disclosure includes a conductive film layer on a side of the encapsulation structure away from the base substrate. In the process of preparing the display substrate, when the protective film layer on the side of the conductive film layer away from the base substrate, static electricity generated by the separation of the film layer can be released to the conductive film layer. Thus, the problem that electrons transition to the active layer of the thin-film transistor in the display substrate when the protective film layer is peeled off to cause offset of the threshold voltage of the thin-film transistor is avoided. The display brightness uniformity of the display substrate can be ensured.

Figure 7:
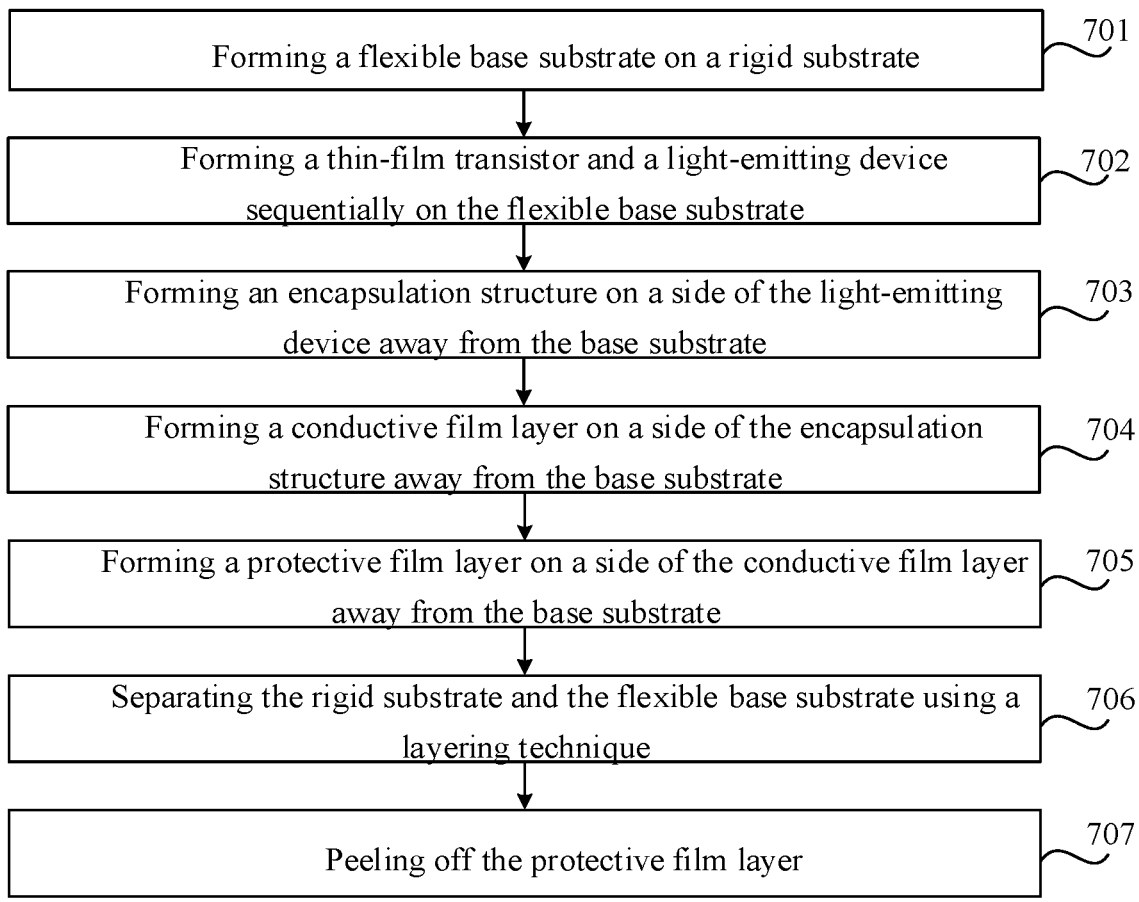
FIG. 7 is a flow chart of a method for manufacturing a display substrate according to an embodiment of the present disclosure.

FIG. 7 is a flow chart of a method for manufacturing a display substrate according to an embodiment of the present disclosure. As shown in FIG. 7, the method may include the following working processes.

In step 701, a flexible base substrate is formed on a rigid substrate.

The flexible display substrate generally uses a flexible base substrate (for example, a flexible PI film) as a carrier. Due to the poor shaping ability of the flexible base substrate, in the preparation of the flexible display substrate, the flexible base substrate is generally disposed on a rigid substrate to complete the subsequent preparation of the film.

Optionally, the rigid substrate may be made of a hard material, such as glass, silicon wafer, quartz, or plastic. The flexible base substrate can be formed on the rigid substrate by coating.

In step 702, a thin-film transistor and a light-emitting device are sequentially formed on the flexible base substrate.

Optionally, the light-emitting device may be an OLED device, such as an AMOLED device. Alternatively, the light-emitting device may also be a QLED device, which is not limited by the embodiment of the present disclosure.

Optionally, the thin-film transistor may be formed by a patterning process for multiple times. The display substrate has a display area and a peripheral area surrounding the display area. The thin-film transistor in the display substrate includes a thin-film transistor in the pixel circuit in the display area, and a thin-film transistor (which may also be referred to as a drive transistor) in the drive circuit in the peripheral area. The thin-film transistor in the display area and the thin-film transistor in the peripheral area may be prepared simultaneously, and may also be separately prepared, which is not limited in the embodiment of the present disclosure. A single patterning process may include photoresist coating, exposure, development, etching, and photoresist stripping.

Optionally, the light-emitting device may be formed by an evaporation process.

Figure 8:
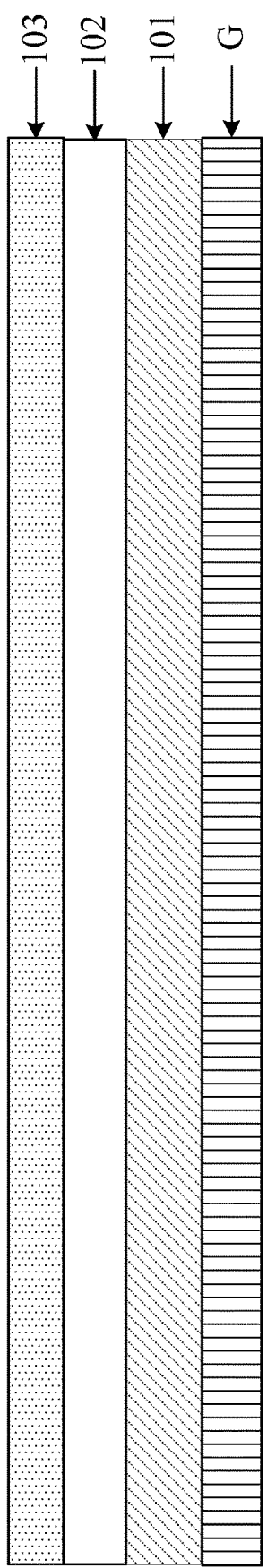
FIG. 8 is a schematic diagram of a base substrate formed with a thin-film transistor and a light-emitting device according to an embodiment of the present disclosure.

Exemplarily, FIG. 8 is a schematic diagram of a base substrate formed with a thin-film transistor and a light-emitting device according to an embodiment of the present disclosure. As shown in FIG. 8, a thin-film transistor 102 and a light-emitting device 103 are sequentially formed on a flexible base substrate 101 on a rigid substrate G.

In step 703, an encapsulation structure is formed on a side of the light-emitting device away from the base substrate.

Since the effect of light-emitting device will be affected after the light-emitting material layer in the light-emitting device is in contact with water or oxygen, an encapsulation structure needs to be provided to protect the light-emitting device, thereby preventing water or oxygen from entering the interior of the display substrate to affect the quality and service life of the light-emitting device.

Optionally, thin-film encapsulation (TFE) may be performed on the base substrate formed with the thin-film transistor and the light-emitting device. In order to protect the display substrate effectively, a plurality of encapsulation layers may be formed on the side of the light-emitting device away from the base substrate.

For example, the implementation process of the foregoing step 703 includes the followings.

In step 7031, a first inorganic encapsulation layer is formed on a side of the light-emitting device away from the base substrate.

Optionally, the first inorganic encapsulation layer is formed on the side of the light-emitting device away from the base substrate with a chemical vapor deposition (CVD) method. The material for forming the first inorganic encapsulation layer may be SiON.

In step 7032, an organic encapsulation layer is formed on a side of the first inorganic encapsulation layer away from the base substrate.

Optionally, an organic encapsulation layer is formed on the side of the first inorganic encapsulation layer away from the base substrate with an Injet Patterning (IJP) method. The material for forming the organic encapsulation layer may be PI or PET.

In step 7033, a second inorganic encapsulation layer is formed on a side of the organic encapsulation layer away from the base substrate.

Optionally, a second inorganic encapsulation layer is formed on the side of the organic encapsulation layer away from the base substrate with a CVD method. The material for forming the second inorganic encapsulation layer may be SiNx.

Figure 9:
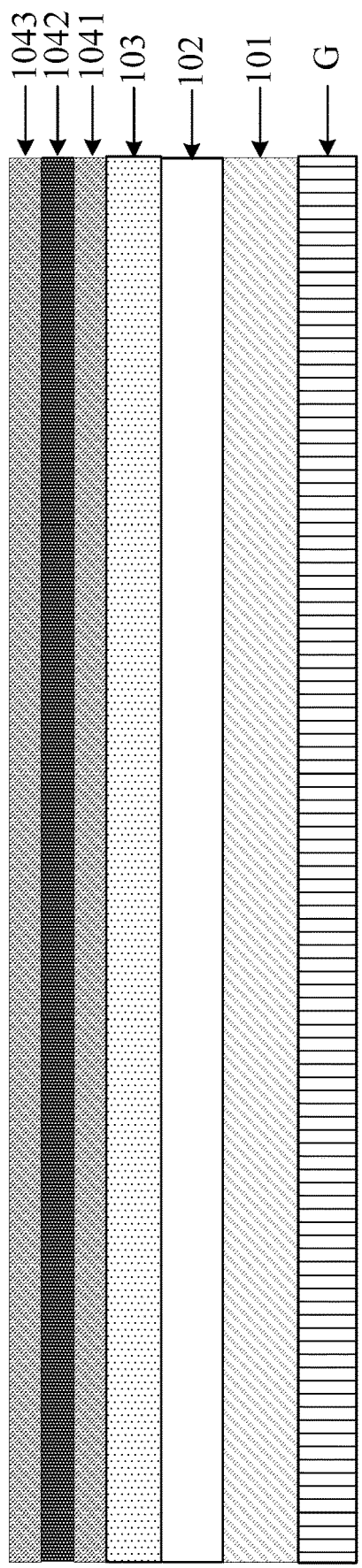
FIG. 9 is a schematic diagram of a base substrate formed with an encapsulation structure according to an embodiment of the present disclosure.

Exemplarily, FIG. 9 is a schematic diagram of a base substrate formed with an encapsulation structure according to an embodiment of the present disclosure. As shown in FIG. 9, the encapsulation structure on the flexible base substrate 101 on the rigid substrate G includes a first inorganic encapsulation layer 1041, an organic encapsulation layer 1042, and a second inorganic encapsulation layer 1043.

In step 704, a conductive film layer is formed on a side of the encapsulation structure away from the base substrate.

Optionally, a conductive film layer may be formed on the side of the encapsulation structure away from the base substrate with a low temperature physical vapor deposition (PVD) method or a low temperature sputtering method.

As an optional implementation, a transparent conductive material layer totally covering the surface of the encapsulation structure is formed on the side of the encapsulation structure away from the base substrate by using a transparent conductive material. The transparent conductive material may be an ITO material.

Figure 10:
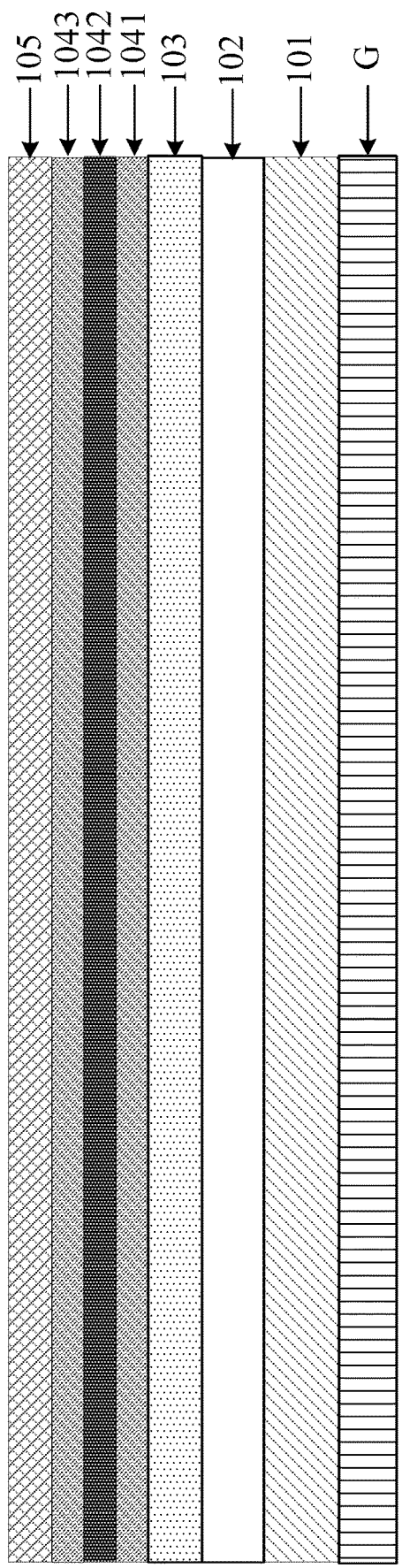
FIG. 10 is a schematic view of a base substrate formed with a conductive film layer according to an embodiment of the present disclosure.

Exemplarily, FIG. 10 is a schematic diagram of a base substrate formed with a conductive film layer according to an embodiment of the present disclosure. As shown in FIG.

10, the conductive film layer 105 on the flexible base substrate 101 on the rigid substrate G is a whole layer structure.

It should be noted that, since the conductive film layer is a transparent conductive film layer, the conductive film layer can be prevented from affecting the light-emitting effect of the light-emitting device, and thereby the light-emitting efficiency of the display substrate can be ensured. The manufacturing process of the display substrate can be simplified by disposing a transparent conductive film layer on the whole surface of the encapsulation structure.

Figure 11:
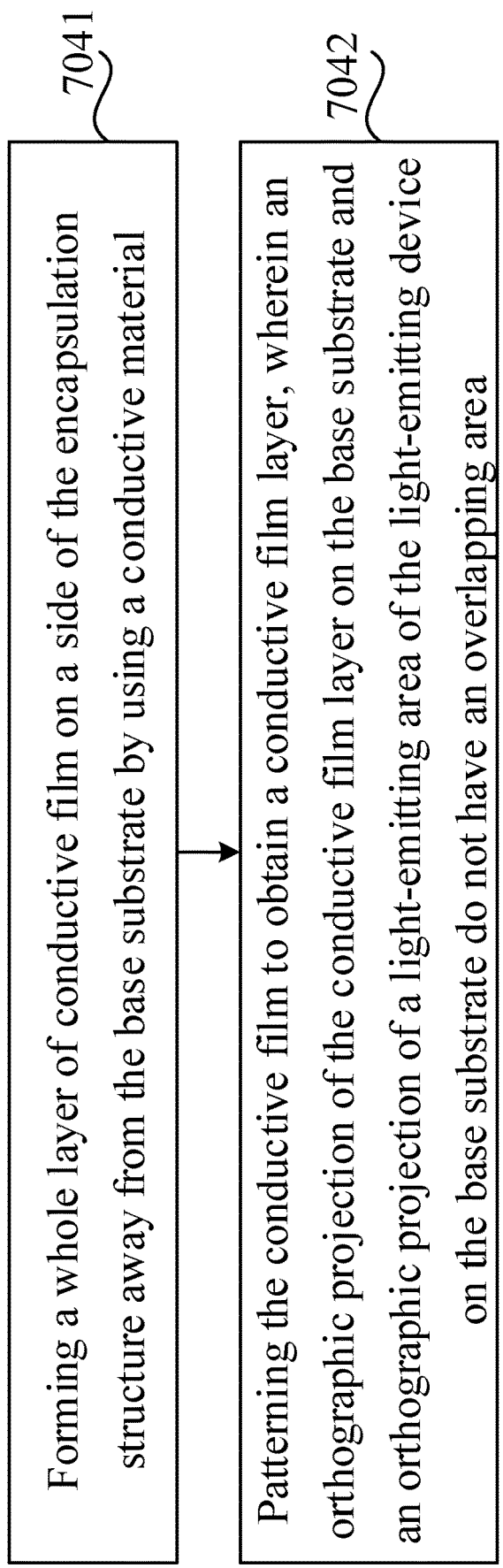
FIG. 11 is a flow chart of a method for forming a conductive film layer on a side of an encapsulation structure away from a base substrate according to an embodiment of the present disclosure.

As another optional implementation, FIG. 11 is a flow-chart of a method for forming a conductive film layer on a side of an encapsulation structure away from a base substrate according to an embodiment of the present disclosure. As shown in FIG. 11, the method may include the following working processes.

In step 7041, a whole layer of conductive film is formed on the side of the encapsulation structure away from the base substrate by using a conductive material.

Optionally, the conductive material may be a transparent conductive material and may also be a non-transparent conductive material, which is not limited in the embodiment of the present disclosure. Optionally, the conductive film totally covering the surface of the encapsulation structure may be formed with a PVD method.

Exemplarily, a schematic diagram of a base substrate formed with a whole layer of conductive film may be made reference to FIG. 10.

In step 7042, the conductive film is patterned to obtain a conductive film layer. The orthographic projection of the conductive film layer on the base substrate and the orthographic projection of the light-emitting area of the light-emitting device on the base substrate do not have an overlapping area.

Optionally, the patterning process may be a low temperature lithography etching process. It should be noted that, since there is no overlapping area between the orthographic projection of the conductive film layer on the base substrate and the orthographic projection of the light-emitting area of the light-emitting device on the base substrate, the light-emitting area of the light-emitting device can be effectively prevented from being blocked by the conductive film layer to affect the light-emitting effect, which further ensures the display effect of the display substrate.

Figure 12:
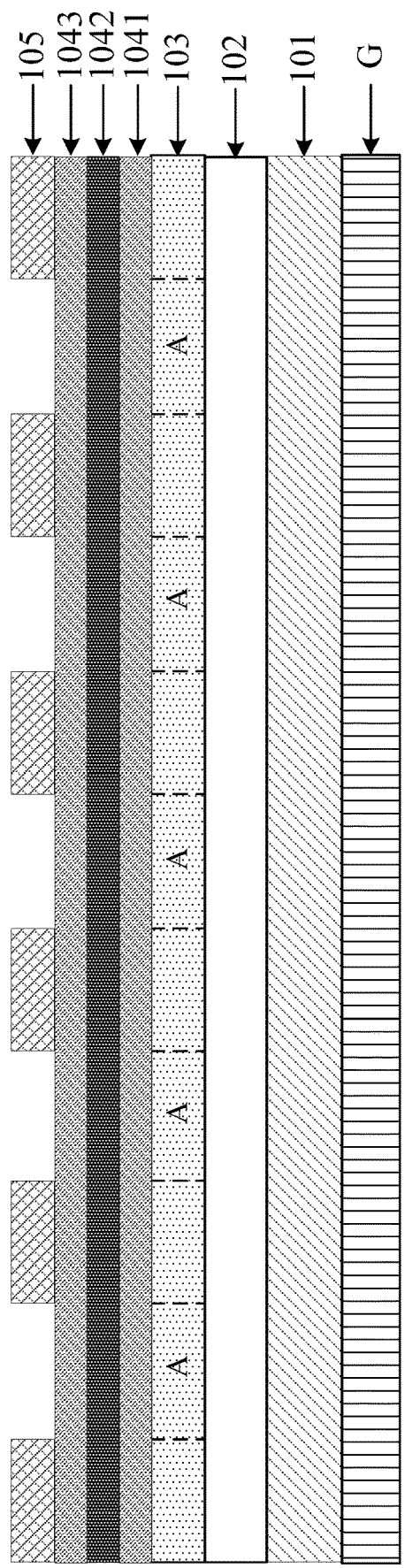
FIG. 12 is a schematic diagram of another base substrate formed with a conductive film layer according to an embodiment of the present disclosure.

Exemplarily, FIG. 12 is a schematic diagram of another base substrate formed with a conductive film layer according to an embodiment of the present disclosure. As shown in FIG. 12, there is no overlapping area between the orthographic projection of the conductive film layer 105 on the base substrate 101 and the orthographic projection of the light-emitting area A of the light-emitting device 103 on the base substrate 101.

In step 705, a protective film layer is formed on a side of the conductive film layer away from the base substrate.

The protective film layer is used to protect the encapsulation structure, avoiding the encapsulation structure from being damaged during the subsequent processes to affect the encapsulation effect on the light-emitting device. Optionally, the protective film layer may be formed on the side of the conductive film layer away from the base substrate by lamination. A protective film sheet may be attached to the side of the conductive film layer away from the base substrate. The material for forming the protective film layer may be tetrapropylene fluoride rubber.

Figure 13:
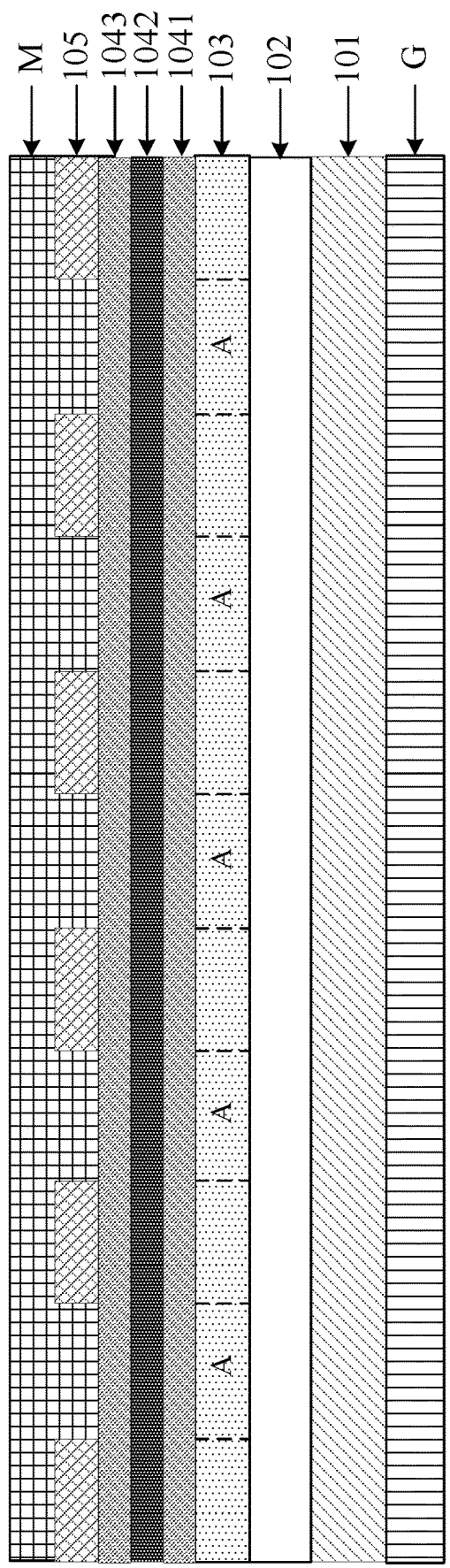
FIG. 13 is a schematic diagram of a base substrate formed with a protective film layer according to an embodiment of the present disclosure.

Exemplarily, FIG. 13 is a schematic diagram of a base substrate 101 formed with a protective film layer M according to an embodiment of the present disclosure.

In step 706, the rigid substrate and the flexible base substrate are separated with a layering technique.

Optionally, the layering technique may be a Laser Lift Off (LLO) technology. After the rigid substrate is separated from the flexible base substrate by the layering technique, a back film may be attached to the side of the flexible base substrate away from the light-emitting device to protect the flexible base substrate.

Figure 14:
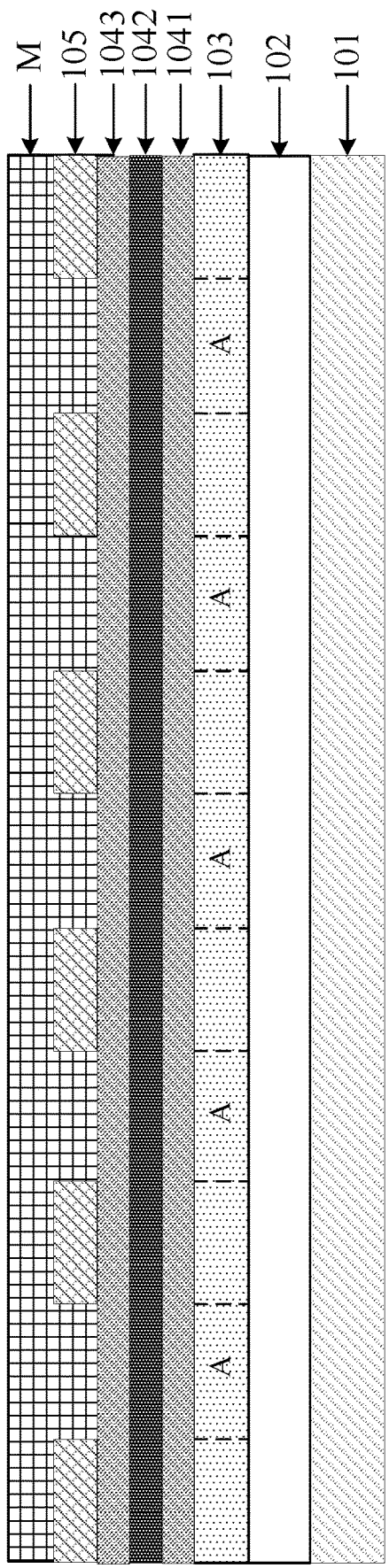
FIG. 14 is a schematic diagram of a flexible base substrate after being separated from a rigid substrate according to an embodiment of the present disclosure.

Exemplarily, FIG. 14 is a schematic diagram of a flexible base substrate 101 separated from a rigid substrate provided in an embodiment of the present disclosure.

In step 707, the protective film layer is peeled off.

Optionally, when the protective film layer is an attached protective film sheet, the protective film sheet may be peeled off. After the protective film layer is peeled off, the display substrate may be subjected to a dicing process by laser cutting to obtain a plurality of display substrates.

It should be noted that the sequence of the steps of the method for manufacturing a display substrate provided in the embodiment of the present disclosure may be appropriately adjusted, and the steps may be correspondingly added or removed based on situation. Any method that can be easily conceived by those skilled in the art within the technical scope disclosed by the present disclosure shall be within in the protection scope of the present disclosure, and therefore will not be described again.

In summary, with the method for manufacturing a display substrate provided in the embodiment of the present disclosure, by forming a conductive film layer on a side of the encapsulation structure away from the base substrate, when the protective film layer on the side of the conductive film layer away from the base substrate is peeled off, static electricity generated by separation of the film layer can be released to the conductive film layer. Thus, the problem that electrons transition to the active layer of the thin-film transistor in the display substrate when the protective film layer is peeled off to cause offset of the threshold voltage of the thin-film transistor is avoided. The display brightness uniformity of the display substrate can be ensured.

An embodiment of the present disclosure provides a display device. The display device may include any of the display substrates shown in FIG. 1 to FIG. 6. The display device may be any product or part with a display function, such as an electronic paper, an OED panel, an AMOLED panel, a QLED display panel, a mobile phone, a tablet computer, a TV, a display, a laptop computer, a digital photo frame, a navigator, and the like.

The foregoing descriptions are merely optional embodiments of the present disclosure, and are not intended to limit the present disclosure. Within the spirit and principles of the disclosure, any modifications, equivalent substitutions, improvements, etc., are within the protection scope of the present disclosure.

What is claimed is:
1. A display substrate, comprising:
a base substrate, and a thin-film transistor, a light-emitting device, an encapsulation structure, and a conductive film layer sequentially disposed on the base substrate in a direction away from the base substrate;
wherein the conductive film layer has an integrated structure;
an orthographic projection of the conductive film layer on the base substrate and an orthographic projection of a light-emitting area of the light-emitting device on the base substrate do not have an overlapping area; and the thin-film transistor comprises at least one of a low-temperature polysilicon transistor and an oxide transistor.

2. The display substrate of claim 1, wherein the conductive film layer is a transparent conductive film layer.

3. The display substrate of claim 1, wherein the conductive film layer is made of an indium tin oxide material.

4. The display substrate of claim 1, wherein a thickness of the conductive film layer ranges from 600 angstroms to 800 angstroms.

5. The display substrate of claim 1, wherein the encapsulation structure comprises a plurality of laminated encapsulation layers, the plurality of encapsulation layers comprising an inorganic encapsulation layer and an organic encapsulation layer.

6. The display substrate of claim 5, wherein the encapsulation structure comprises a first inorganic encapsulation layer, an organic encapsulation layer, and a second inorganic encapsulation layer disposed in a direction away from the base substrate.

7. The display substrate of claim 6, wherein material of the first inorganic encapsulation layer is different from material of the second inorganic encapsulation layer.

8. The display substrate of claim 6, wherein the first inorganic encapsulation layer is made of a silicon oxynitride material, and the second inorganic encapsulation layer is made of a silicon nitride material.

9. The display substrate of claim 1, wherein the display substrate has a display area and a peripheral area surrounding the display area; and a thin-film transistor in a pixel circuit in the display area is the oxide transistor, and a thin-film transistor in a drive circuit in the peripheral area is the low-temperature polysilicon transistor.

10. The display substrate of claim 1, wherein the base substrate is a flexible base substrate, an orthographic projection of the conductive film layer on the base substrate and an orthographic projection of a light-emitting area of the light-emitting device on the base substrate have no overlapping area; and the encapsulation structure comprises a first inorganic encapsulation layer, an organic encapsulation layer, and a second inorganic encapsulation layer disposed in a direction away from the base substrate.

11. A method for manufacturing a display substrate, comprising:

forming a flexible base substrate on a rigid substrate;

forming a thin-film transistor and a light-emitting device sequentially on the flexible base substrate;

forming an encapsulation structure on a side of the light-emitting device away from the base substrate;

forming a conductive film layer on a side of the encapsulation structure away from the base substrate;

forming a protective film layer on a side of the conductive film layer away from the base substrate;

separating the rigid substrate from the flexible base substrate by using a layering technique; and peeling off the protective film layer.

12. The method of claim 11, wherein forming a conductive film layer on a side of the encapsulation structure away from the base substrate comprises:

forming a transparent conductive film layer totally covering the surface of the encapsulation structure on the side of the encapsulation structure away from the base substrate with a transparent conductive material.

13. The method of claim 11, wherein forming a conductive film layer on a side of the encapsulation structure away from the base substrate comprises:

forming a whole layer of conductive thin-film on the side of the encapsulation structure away from the base substrate with a conductive material; and patterning the conductive thin-film to obtain the conductive film layer, wherein an orthographic projection of the conductive film layer on the base substrate and an orthographic projection of a light-emitting area of the light-emitting device on the base substrate have no overlapping area.

14. The method of claim 11, wherein forming a conductive film layer on a side of the encapsulation structure away from the base substrate comprises:

forming the conductive film layer on the side of the encapsulation structure away from the base substrate by one of a low temperature physical vapor deposition method and a low temperature sputtering method.

15. The method of claim 11, wherein forming an encapsulation structure on a side of the light-emitting device away from the base substrate comprises:

forming a first inorganic encapsulation layer on the side of the light-emitting device away from the base substrate;

forming an organic encapsulation layer on a side of the first inorganic encapsulation layer away from the base substrate; and forming a second inorganic encapsulation layer on a side of the organic encapsulation layer away from the base substrate.

16. The method of claim 11, wherein forming a protective film layer on a side of the conductive film layer away from the base substrate comprises:

attaching a protective film sheet on the side of the conductive film layer away from the base substrate; and peeling off the protective film layer comprises:

peeling off the protective film sheet.

17. A display device, comprising a display substrate; wherein the display substrate comprises a base substrate, and a thin-film transistor, a light-emitting device, an encapsulation structure, and a conductive film layer sequentially disposed on the base substrate in a direction away from the base substrate;

wherein the conductive film layer has an integrated structure;

an orthographic projection of the conductive film layer on the base substrate and an orthographic projection of a light-emitting area of the light-emitting device on the base substrate do not have an overlapping area; and the thin-film transistor comprises at least one of a low-temperature polysilicon transistor and an oxide transistor.

* * * * *